United States Patent
Ding et al.

(10) Patent No.: US 12,145,878 B2
(45) Date of Patent: Nov. 19, 2024

(54) ENERGY-SAVING WINDOW FILM USED FOR INSULATING GLASS AND PREPARATION METHOD AND APPLICATION THEREOF

(71) Applicant: Changzhou Sanyou Dissan Protective Materials MFG Co., Ltd., Changzhou (CN)

(72) Inventors: Feng Ding, Changzhou (CN); Lanfang Wang, Changzhou (CN); Qiangguo Zhao, Changzhou (CN); Xiaoyan Ben, Changzhou (CN); Chenxin Wang, Changzhou (CN); Xin Wang, Changzhou (CN); Jianda Wu, Changzhou (CN)

(73) Assignee: Changzhou Sanyou Dissan Protective Materials MFG Co., Ltd., Changzhou (CN)

( * ) Notice: Subject to any disclaimer, the term of this patent is extended or adjusted under 35 U.S.C. 154(b) by 240 days.

(21) Appl. No.: 17/889,209

(22) Filed: Aug. 16, 2022

(65) Prior Publication Data

US 2023/0406762 A1 Dec. 21, 2023

Related U.S. Application Data

(63) Continuation of application No. PCT/CN2022/100691, filed on Jun. 23, 2022.

(51) Int. Cl.
*C23C 14/08* (2006.01)
*C03C 17/36* (2006.01)
(Continued)

(52) U.S. Cl.
CPC .......... *C03C 17/42* (2013.01); *C03C 17/3618* (2013.01); *C03C 17/3626* (2013.01);
(Continued)

(58) Field of Classification Search
None
See application file for complete search history.

(56) References Cited

U.S. PATENT DOCUMENTS

2004/0020761 A1* 2/2004 Thomsen ............. C03C 17/002
 204/192.12
2013/0108803 A1* 5/2013 Matos ............... H01J 37/32357
 118/723 R

FOREIGN PATENT DOCUMENTS

KR 100329906 B1 * 3/2002

* cited by examiner

*Primary Examiner* — Jason Berman
(74) *Attorney, Agent, or Firm* — Ming Jiang; MM IP SERVICES LLC

(57) ABSTRACT

A preparation method of an energy-saving window film used for insulating glass sputters metals, metal oxides and nitrides on a surface of a high-strength base film in a layer-by-layer manner by a magnetron sputtering process, so as to reduce an infrared emissivity of film layers and effectively block an infrared transmission without affecting a daylighting field of vision; by coating a modified polyurethane acrylate protective layer on a surface of a low radiation layer, an oxidation resistance of the coating is improved; an installation adhesive layer provides an adhesion of the film to the glass, which can enhance the impact strength of the glass and play the role of safety and explosion-proof. The energy-saving window film is applied to the insulating glass with multiple functions such as impact resistance, lightness, energy-saving heat preservation, oxidation resistance, etc., which extends the overall service life of the insulating glass.

10 Claims, 2 Drawing Sheets

(51) Int. Cl.
*C03C 17/38* (2006.01)
*C03C 17/42* (2006.01)
*C08J 5/18* (2006.01)
*C09J 133/04* (2006.01)
*C09J 175/14* (2006.01)
*C23C 14/06* (2006.01)
*C23C 14/14* (2006.01)
*C23C 14/20* (2006.01)
*C23C 14/35* (2006.01)

(52) U.S. Cl.
CPC ...... *C03C 17/3639* (2013.01); *C03C 17/3644* (2013.01); *C03C 17/3649* (2013.01); *C03C 17/366* (2013.01); *C03C 17/3681* (2013.01); *C03C 17/38* (2013.01); *C08J 5/18* (2013.01); *C09J 133/04* (2013.01); *C09J 175/14* (2013.01); *C23C 14/0641* (2013.01); *C23C 14/08* (2013.01); *C23C 14/083* (2013.01); *C23C 14/14* (2013.01); *C23C 14/205* (2013.01); *C23C 14/35* (2013.01); *C03C 2218/11* (2013.01); *C03C 2218/156* (2013.01); *C03C 2218/32* (2013.01); *C08J 2367/02* (2013.01); *C08J 2369/00* (2013.01)

ENERGY-SAVING WINDOW FILM USED FOR INSULATING GLASS AND PREPARATION METHOD AND APPLICATION THEREOF

TECHNICAL FIELD

The disclosure relates to the field of functional film materials, and in particular to an energy-saving window film used for insulating glass, a preparation method of an energy-saving window film used for insulating glass, and an application of an energy-saving window film used for insulating glass.

BACKGROUND

Glass will be more and more widely used in architecture. Energy conservation, emission reduction, low carbon, environmental protection, green and ecology are a main melody of today's architectural development. Glass is developing towards two major functions: safety and energy saving. Nowadays, there are many ways to improve thermal insulation performance and safety of glass doors and windows in the market. The existing laminated glass can prevent splashing of shards of glass and ensure safety. A heat transfer coefficient of glass and intermediate film is high, and its heat preservation and energy saving performance is poor. Existing insulating glass mainly saves energy by coating (such as low emissivity glass, abbreviation as LOW-E glass, or low radiation glass) or adding curtains (such as shutters or sunshade films) to an insulating layer. However, when the glass is accidentally broken, the splashing or falling of the shards of glass will cause hidden dangers to personal safety. When retrofitting some insulating glass in existing buildings, by attaching an explosion-proof film on an outside of the insulating glass to increase the safety function, the heat transfer performance of the entire insulating glass has no obvious improvement effect.

In the prior art, the coating or a suspended film has no effect on improving the impact strength of the glass sheet of the insulating glass, and has no adhesion to the glass after the glass is broken, and has no safety protection effect. A low radiation film is exposed to the outside, and it is easy to appear that the low radiation film is oxidized when exposed to the environment before installation, the coating of the low radiation film gradually changes color and fails, thus the reduction of the overall heat transfer coefficient of the insulating glass after the low radiation film is pasted to the glass is not good enough, and position differences of the low radiation film on the inner walls of two pieces glass of the insulating glass has a great impact on the overall heat transfer coefficient.

SUMMARY

A purpose of the disclosure is to provide an energy-saving window film used for insulating glass, a preparation method of an energy-saving window film used for insulating glass and an application of an energy-saving window film used for insulating glass. When the prepared energy-saving window film is applied to the insulating glass, it can increase the impact strength of the glass and play the role of safety and explosion-proof; at the same time, on the basis of realizing the lightness and thinness of the window film, it has a lower emissivity and can play a good role in energy saving and heat preservation; it has good oxidation resistance, which ensures its stable performance and prolongs its overall service life.

The disclosure solves the technical problem by adopting the following technical schemes.

The disclosure provides a preparation method of an energy-saving window film used for insulating glass, including the following steps:

selecting a high-strength base film, wherein the high-strength base film includes two opposite surfaces, which are a first surface and a second surface respectively;

sputtering materials on the first surface of the high-strength base film in a layer-by-layer manner by a magnetron sputtering process to form a low radiation layer; wherein at least one of the materials is selected from the group consisting of titanium dioxide ($TiO_2$), nickel chromium (NiCr), argentum (Ag), titanium nitrogen (TiN), tungsten trioxide ($WO_3$), diindium trioxide trihydrate ($In_2O_3$) and stannic oxide ($SnO_2$); and the low radiation layer may include one selected from the group consisting of a structure of $TiO_2$/NiCr/Ag/$TiO_2$/$TiO_2$/NiCr/Ag/$TiO_2$, a structure of TiN/NiCr/Ag/$TiO_2$/$TiO_2$/NiCr/Ag/TiN, and a structure of TiN/$In_2O_3$/Ag/$TiO_2$/$TiO_2$/$In_2O_3$/Ag/TiN;

obtaining an installation adhesive liquid and a coating protective liquid after carrying out operations of installation adhesive liquid making and coating protective layer liquid making; and coating the coating protective liquid on a surface of the low radiation layer to form a coating protective layer; and coating the installation adhesive liquid on the second surface of the high-strength base film, drying and then laminating with a release film (also referred to as protective film).

In a preferred embodiment of the disclosure, the high-strength base film is one of a polyethylene terephthalate film and a polycarbonate film.

In a preferred embodiment of the disclosure, a thickness of each layer in the structure of $TiO_2$/NiCr/Ag/$TiO_2$/$TiO_2$/NiCr/Ag/$TiO_2$ is in a range of 5 nm to 20 nm.

In a preferred embodiment of the disclosure, the operation of installation adhesive liquid making includes: mixing and mechanically stirring 30 to 60 parts of an acrylic resin, 20 to 40 parts of a first solvent, 0.5 to 5 parts of an ultraviolet (UV) absorbent, and 0.5 to 1 parts of a curing agent.

In a preferred embodiment of the disclosure, the operation of coating protective layer liquid making includes: mixing and mechanically stirring 10 to 30 parts of a modified polyurethane acrylate, 5 to 20 parts of other resins, 1 to 10 parts of a photoinitiator, 0.01 to 0.1 parts of a leveling agent and 30 to 50 parts of a second solvent; wherein components of the other resins include pentaerythritol triacrylate (PETA), hexanediol diacrylate (HDDA), trimethylolpropane triacrylate (TMPTA) and acrylic acid.

In a preferred embodiment of the disclosure, after coating the coating protective liquid on the surface of the low radiation layer, the preparation method further includes: performing drying and UV curing to form the coating protective layer.

In a preferred embodiment of the disclosure, a thickness of the coating protective layer is in a range of 0.5 μm to 3 μm.

In a preferred embodiment of the disclosure, the first solvent includes one or more selected from the group consisting of toluene, xylene, ethyl acetate, butyl acetate, acetone, butanone and methyl isobutyl ketone; and the second solvent includes one or more selected from the group consisting of ethanol, toluene, ethyl acetate, butyl acetate, acetone, butanone and methyl isobutyl ketone.

The disclosure further provides an energy-saving window film used for insulating glass; the energy-saving window film used for insulating glass is prepared by the above preparation method of the energy-saving window film used for insulating glass.

The disclosure further provides an application of the above energy-saving window film used for insulating glass; specifically, the energy-saving window film used for insulating glass is applied to a surface of the insulating glass, the energy-saving window film used for insulating glass can be installed on any surface inside a cavity of the insulating glass or all surfaces inside the cavity of the insulating glass.

The beneficial effects of the energy-saving window film used for insulating glass and preparation method and application thereof provided by the embodiments of the disclosure are as follows.

Through the use of the high-strength base film, it can increase the impact strength of the glass and play the role of safety and explosion-proof; the low radiation layer uses the structure of $TiO_2/NiCr/Ag/TiO_2/TiO_2/NiCr/Ag/TiO_2$ or other structures, specifically, the above metals and metal oxides (such as $TiO_2$, NiCr, Ag, TiN, $WO_3$, $In_2O_3$, $SnO_2$, etc.) are respectively sputtered on the surface of the high-strength base film by the magnetron sputtering process, which reduces the radiation rate of film layers. The oxidation resistance of the coating is improved by coating the modified polyurethane acrylate protective layer on the surface of the formed low radiation layer.

Furthermore, the energy-saving window film used for insulating glass provided by the embodiments of the disclosure has the flexible characteristics that the glass cannot replace. Sticking the energy-saving window film on the inner wall of the insulating glass can enhance the impact strength of the glass, effectively reduce the thickness of the glass on both sides, and reduce the weight of the overall structure of the glass. In addition, after tempered glass is accidentally broken, it can prevent the splashing and falling of shards of glass from causing personal injury. Moreover, the energy-saving window film used for insulating glass provided by the embodiments of the disclosure is a low radiation window film, which further reduces the overall heat transfer performance of the insulating glass. Therefore, the energy-saving window film used for insulating glass and its preparation method provided by the embodiments of the disclosure are applied to the field of glass (such as architectural glass) and have important commercial promotion value.

BRIEF DESCRIPTION OF THE DRAWINGS

In order to explain the technical schemes of embodiments of the disclosure more clearly, the following will briefly introduce the drawings used in the embodiments. It should be understood that the following drawings only show some of the embodiments of the disclosure, and therefore should not be regarded as limiting the scope. For those skilled in the art, other relevant drawings can be obtained according to these drawings without paying creative labor.

DESCRIPTION OF REFERENCE NUMERALS

Figure 1:
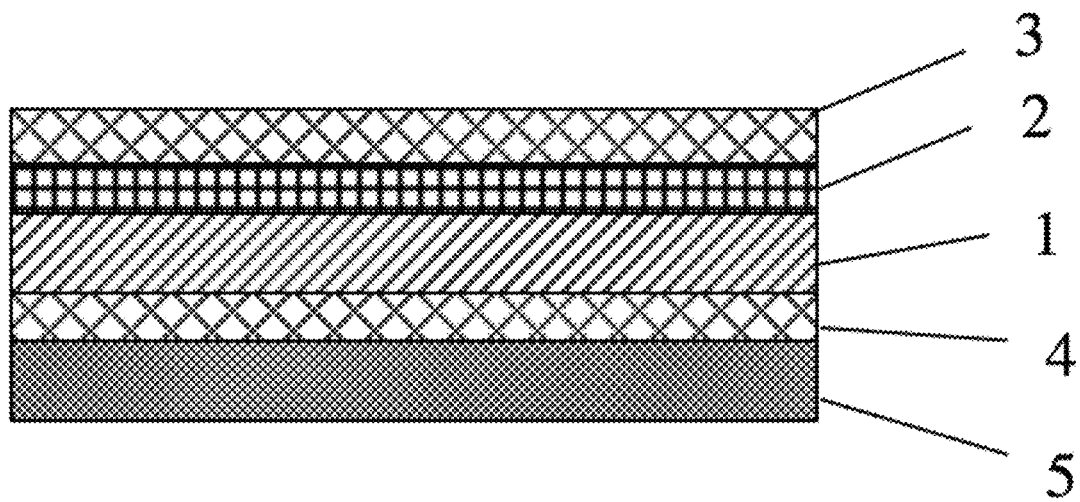
FIG. 1 is a schematic diagram of a layered structure of an energy-saving window film used for insulating glass according to an embodiment of the disclosure.

1: high-strength base film; 2: low radiation layer; 3: coating protective layer; 4: installation adhesive layer; 5: release film.

DETAILED DESCRIPTION OF THE EMBODIMENTS

In order to make the purposes, technical schemes and advantages of embodiments of the disclosure clearer, the technical schemes in the embodiments of the disclosure will be clearly and completely described below. If specific conditions are not indicated in the embodiments, conventional conditions or conditions recommended by manufacturers shall be followed. Reagents or instruments used without manufacturers indicated are all conventional products that can be purchased on the market.

The energy-saving window film used for insulating glass and its preparation method and application are described in detail below.

The embodiment of the disclosure proposes a preparation method of an energy-saving window film used for insulating glass, which includes the steps S1 to S4.

S1, selecting a high-strength base film; the high-strength base film includes two opposite surfaces, which are a first surface and a second surface respectively. It should be noted that the high-strength base film provided by the embodiment of the disclosure is preferably a polyethylene terephthalate film or a polycarbonate film. It should be noted that by using the high-strength base film, the impact strength of glass can be increased and the safety and explosion-proof effect can be achieved.

S2, sputtering materials on the first surface of the high-strength base film in a layer-by-layer manner by a magnetron sputtering process to form a low radiation layer; at least one of the materials may be titanium dioxide ($TiO_2$), nickel chromium (NiCr), argentum (Ag), titanium nitrogen (TiN), tungsten trioxide ($WO_3$), diindium trioxide trihydrate ($In_2O_3$), stannic oxide ($SnO_2$) or other composites; and the low radiation layer may be composed of a structure of $TiO_2/NiCr/Ag/TiO_2/TiO_2/NiCr/Ag/TiO_2$, a structure of $TiN/NiCr/Ag/TiO_2/TiO_2/NiCr/Ag/TiN$, a structure of $TiN/In_2O_3/Ag/TiO_2/TiO_2/In_2O_3/Ag/TiN$, or other structures. It should be noted that, preferably, a thickness of each layer in the structure of the low radiation layer is in a range of 5 nm to 20 nm, the low radiation function of the low radiation layer can be realized while ensuring the lightness and thinness of the energy-saving window film.

S3, obtaining an installation adhesive liquid and a coating protective liquid after carrying out operations of installation adhesive liquid making and coating protective layer liquid making.

What needs to be further specified is that, the operation of the installation adhesive liquid making includes: mixing and mechanically stirring 30 to 60 parts of an acrylic resin, 20 to 40 parts of a first solvent, 0.5 to 5 parts of an ultraviolet (UV) absorbent and 0.5 to 1 parts of a curing agent. The operation of the coating protective layer liquid making includes: mixing and mechanically stirring 10 to 30 parts of a modified polyurethane acrylate, 5 to 20 parts of other resins, 1 to 10 parts of a photoinitiator, 0.01 to 0.1 parts of a leveling agent and 30 to 50 parts of a second solvent, and components of the other resins include pentaerythritol triacrylate (PETA), hexanediol diacrylate (HDDA), trimethylolpropane triacrylate (TMPTA) and acrylic acid. It should be emphasized that the embodiment of the disclosure preferably, the first solvent includes one or more selected from the group consisting of toluene, xylene, ethyl acetate, butyl acetate, acetone, butanone and methyl isobutyl ketone; and the second solvent includes one or more selected from the group consisting of ethanol, toluene, ethyl acetate, butyl acetate, acetone, butanone and methyl isobutyl ketone.

In addition, it should be noted that the modified polyurethane acrylate provided by the embodiment of the disclosure is a modified polyurethane acrylate emulsion obtained by mixing high molecular weight polyvinylidene fluoride homopolymer resin and special solvent for fluorocarbon, grinding and adding it to polyurethane acrylate solution, and performing ultrasonic dispersion to particle size of 50 nm to 100 nm. It should be emphasized that, compared with commonly used polyurethane acrylate, the modified polyurethane acrylate provided by the embodiment of the disclosure has excellent weather resistance, oil repellency, hydrophobicity and photochemical stability.

S4, coating the coating protective liquid on a surface of the low radiation layer to form a coating protective layer; and coating the installation adhesive liquid on the second surface of the high-strength base film, drying and then laminating with a release film. It should be noted that in order to ensure the curing effect and performance stability of the coating protective layer, after coating the coating protective liquid on the surface of the low radiation layer, drying and UV curing are further performed to form the coating protective layer with ideal performance. In addition, it should be emphasized that in order to consider the anti-oxidation protection performance of the coating protective layer and the overall lightness of the energy-saving window film, the embodiment of the disclosure preferably limits the thickness of the coating protective layer to 0.5 μm to 3 μm.

The embodiment of the disclosure further provides an energy-saving window film used for insulating glass. The energy-saving window film used for insulating glass is prepared by the above preparation method of the energy-saving window film used for insulating glass provided by the embodiment of the disclosure. Its specific structure is shown in FIG. 1, including a high-strength base film 1, a low radiation layer 2, a coating protective layer 3, an installation adhesive layer 4 and a release film 5. It should be noted that the energy-saving window film used for insulating glass provided by the embodiment of the disclosure has the flexible characteristics that the glass cannot replace. Sticking the energy-saving window film on the inner wall of the insulating glass can enhance the impact strength of the glass, effectively reduce the thickness of the glass on both sides, and reduce the weight of the overall structure of the glass; after tempered glass is accidentally broken, it can prevent the splashing and falling of shards of glass from causing personal injury. In addition, the energy-saving window film used for the insulating glass provided by the embodiment of the disclosure is a low radiation window film, which further reduces the overall heat transfer performance of the insulating glass.

The embodiment of the disclosure further provides an application of the energy-saving window film used for insulating glass as described above. Specifically, the energy-saving window film used for insulating glass is applied to architectural glass in the construction field, that is, the energy-saving window film used for insulating glass is applied to a surface of the insulating glass, which can be installed on any surface inside a cavity of the insulating glass or all surfaces inside the cavity of the insulating glass. It should be noted that in other embodiments of the disclosure, it is not limited to the application of the energy-saving window film used for the insulating glass provided by the embodiment of the disclosure. It can be applied not only to the architectural glass as the embodiment of the disclosure, but also to other glass, such as automotive glass, as long as it can realize the explosion-proof function of the energy-saving window film, the energy-saving window film provided by the embodiment of the disclosure can be used in the field of low radiation heat insulation performance and oxidation resistance.

The features and performances of the disclosure will be further described in detail below in combination with embodiments.

Embodiment 1

The embodiment provides a preparation method of an energy-saving window film used for insulating glass, which includes the following steps:

S1, A polyethylene terephthalate film is selected as a high-strength base film.

S2, sputtering $TiO_2$, NiCr, Ag, $TiO_2$, $TiO_2$, NiCr, Ag and $TiO_2$ on a surface of the high-strength base film sequentially in that order to form a low radiation layer composed of a structure of $TiO_2$/NiCr/Ag/$TiO_2$/$TiO_2$/NiCr/Ag/$TiO_2$, and a thickness of each layer of the structure of $TiO_2$/NiCr/Ag/$TiO_2$/$TiO_2$/NiCr/Ag/$TiO_2$ is 10 nm.

S3, obtaining an installation adhesive liquid and a coating protective liquid after carrying out operations of installation adhesive liquid making and coating protective layer liquid making. Specifically, the operation of installation adhesive liquid making includes: mixing and mechanically stirring 45 parts of an acrylic resin, 30 parts of a first solvent, 3 parts of an UV absorbent and 0.8 parts of a curing agent; the operation of coating protective layer liquid making includes: mixing and mechanically stirring 20 parts of a modified polyurethane acrylate, 12 parts of other resins, 6 parts of a photoinitiator, 0.06 parts of a leveling agent and 40 parts of a second solvent. Components of the other resins include PETA, HDDA, TMPTA and acrylic acid. Both the first solvent and the second solvent are toluene.

S4, coating the coating protective liquid on a surface of the low radiation layer by precision coating equipment, performing drying and UV curing to form a coating protective layer with a thickness of 2 μm; and coating the installation adhesive liquid on another surface of the high-strength base film, drying and then laminating with a release film.

The embodiment further provides an energy-saving window film used for insulating glass, which is prepared by the preparation method of the energy-saving window film used for insulating glass provided by the embodiment.

Embodiment 2

The embodiment provides a preparation method of an energy-saving window film used for insulating glass, which includes the following steps:

S1, A polycarbonate film is selected as a high-strength base film.

S2, sputtering $TiO_2$, NiCr, Ag, $TiO_2$, $TiO_2$, NiCr, Ag and $TiO_2$ on a surface of the high-strength base film sequentially in that order to form a low radiation layer composed of a structure of $TiO_2$/NiCr/Ag/$TiO_2$/$TiO_2$/NiCr/Ag/$TiO_2$, and a thickness of each layer of the structure of $TiO_2/NiCr/Ag/TiO_2/TiO_2/NiCr/Ag/TiO_2$ is 5 nm.

S3, obtaining an installation adhesive liquid and a coating protective liquid after carrying out operations of installation adhesive liquid making and coating protective layer liquid making. Specifically, the operation of installation adhesive liquid making includes: mixing and mechanically stirring 30 parts of an acrylic resin, 20 parts of a first solvent, 0.5 parts of an UV absorbent and 0.5 parts of a curing agent; the operation of coating protective layer liquid making includes: mixing and mechanically stirring 10 parts of a modified polyurethane acrylate, 5 parts of other resins, 1 part of a photoinitiator, 0.01 parts of a leveling agent and 30 parts of a second solvent. Components of the other resins include PETA, HDDA, TMPTA and acrylic acid. Both the first solvent and the second solvent are ethyl acetate.

S4, coating the coating protective liquid on a surface of the low radiation layer by precision coating equipment, performing drying and UV curing to form a coating protective layer with a thickness of 0.5 μm; and coating the installation adhesive liquid on another surface of the high-strength base film, drying and then laminating with a release film.

The embodiment further provides an energy-saving window film used for insulating glass, which is prepared by the preparation method of the energy-saving window film used for insulating glass provided by the embodiment.

Embodiment 3

The embodiment provides a preparation method of an energy-saving window film used for insulating glass, which includes the following steps:

S1, A polyethylene terephthalate film is selected as a high-strength base film.

S2, sputtering $TiO_2$, NiCr, Ag, $TiO_2$, $TiO_2$, NiCr, Ag and $TiO_2$ on a surface of the high-strength base film sequentially in that order to form a low radiation layer composed of a structure of $TiO_2/NiCr/Ag/TiO_2/TiO_2/NiCr/Ag/TiO_2$, and a thickness of each layer of the structure of $TiO_2/NiCr/Ag/TiO_2/TiO_2/NiCr/Ag/TiO_2$ is 20 nm.

S3, obtaining an installation adhesive liquid and a coating protective liquid after carrying out operations of installation adhesive liquid making and coating protective layer liquid making. Specifically, the operation of installation adhesive liquid making includes: mixing and mechanically stirring 60 parts of an acrylic resin, 40 parts of a first solvent, 5 parts of an UV absorbent and 1 part of a curing agent; the operation of coating protective layer liquid making includes: mixing and mechanically stirring 30 parts of a modified polyurethane acrylate, 20 parts of other resins, 10 parts of a photoinitiator, 0.1 parts of a leveling agent and 50 parts of a second solvent. Components of the other resins include PETA, HDDA, TMPTA and acrylic acid. Both the first solvent and the second solvent are methyl isobutyl ketone.

S4, coating the coating protective liquid on a surface of the low radiation layer by precision coating equipment, performing drying and UV curing to form a coating protective layer with a thickness of 3 μm; and coating the installation adhesive liquid on another surface of the high-strength base film, drying and then laminating with a release film.

The embodiment further provides an energy-saving window film used for insulating glass, which is prepared by the preparation method of the energy-saving window film used for insulating glass provided by the embodiment.

Embodiment 4

The embodiment provides a preparation method of an energy-saving window film used for insulating glass, which includes the following steps:

S1, A polyethylene terephthalate film is selected as a high-strength base film.

S2, sputtering $TiO_2$, NiCr, Ag, $TiO_2$, $TiO_2$, NiCr, Ag and $TiO_2$ on a surface of the high-strength base film sequentially in that order to form a low radiation layer composed of a structure of $TiO_2/NiCr/Ag/TiO_2/TiO_2/NiCr/Ag/TiO_2$, and a thickness of each layer of the structure of $TiO_2/NiCr/Ag/TiO_2/TiO_2/NiCr/Ag/TiO_2$ is 8 nm.

S3, obtaining an installation adhesive liquid and a coating protective liquid after carrying out operations of installation adhesive liquid making and coating protective layer liquid making. Specifically, the operation of installation adhesive liquid making includes: mixing and mechanically stirring 30 parts of an acrylic resin, 40 parts of a first solvent, 0.6 parts of an UV absorbent and 0.9 parts of a curing agent; the operation of coating protective layer liquid making includes: mixing and mechanically stirring 11 parts of a modified polyurethane acrylate, 18 parts of other resins, 3 parts of a photoinitiator, 0.08 parts of a leveling agent and 35 parts of a second solvent. Components of the other resins include PETA, HDDA, TMPTA and acrylic acid. The first solvent is a mixture of toluene and ethyl acetate, and the second solvent is a mixture of acetone, butanone and methyl isobutyl ketone.

S4, coating the coating protective liquid on a surface of the low radiation layer by precision coating equipment, performing drying and UV curing to form a coating protective layer with a thickness of 1.5 μm; and coating the installation adhesive liquid on another surface of the high-strength base film, drying and then laminating with a release film.

The embodiment further provides an energy-saving window film used for insulating glass, which is prepared by the preparation method of the energy-saving window film used for insulating glass provided by the embodiment.

Embodiment 5

The embodiment provides a preparation method of an energy-saving window film used for insulating glass, which includes the following steps:

S1, A polycarbonate film is selected as a high-strength base film.

S2, sputtering $TiO_2$, NiCr, Ag, $TiO_2$, $TiO_2$, NiCr, Ag and $TiO_2$ on a surface of the high-strength base film sequentially in that order to form a low radiation layer composed of a structure of $TiO_2/NiCr/Ag/TiO_2/TiO_2/NiCr/Ag/TiO_2$, and a thickness of each layer of the structure of $TiO_2/NiCr/Ag/TiO_2/TiO_2/NiCr/Ag/TiO_2$ is 6 nm.

S3, obtaining an installation adhesive liquid and a coating protective liquid after carrying out operations of installation adhesive liquid making and coating protective layer liquid making. Specifically, the operation of installation adhesive liquid making includes: mixing and mechanically stirring 58 parts of an acrylic resin, 22 parts of a first solvent, 4.5 parts of an UV absorbent and 0.6 parts of a curing agent; the operation of coating protective layer liquid making includes: mixing and mechanically stirring 25 parts of a modified polyurethane acrylate, 10 parts of other resins, 9 parts of a photoinitiator, 0.06 parts of a leveling agent and 32 parts of a second solvent. Components of the other resins include PETA, HDDA, TMPTA and acrylic acid. The first solvent is a mixture of ethyl acetate and acetone, and the second solvent is a mixture of toluene and methyl isobutyl ketone.

S4, coating the coating protective liquid on a surface of the low radiation layer by precision coating equipment, performing drying and UV curing to form a coating protective layer with a thickness of 0.6 μm; and coating the installation adhesive liquid on another surface of the high-strength base film, drying and then laminating with a release film.

The embodiment further provides an energy-saving window film used for insulating glass, which is prepared by the preparation method of the energy-saving window film used for insulating glass provided by the embodiment Test Example In order to verify and prove the corresponding technical effect of the energy-saving window film used for insulating glass obtained in the embodiment of the disclosure, the disclosure randomly selects the energy-saving window film used for insulating glass from the above embodiment as a sample of the test example, and further sets corresponding comparative examples.

Figure 2:
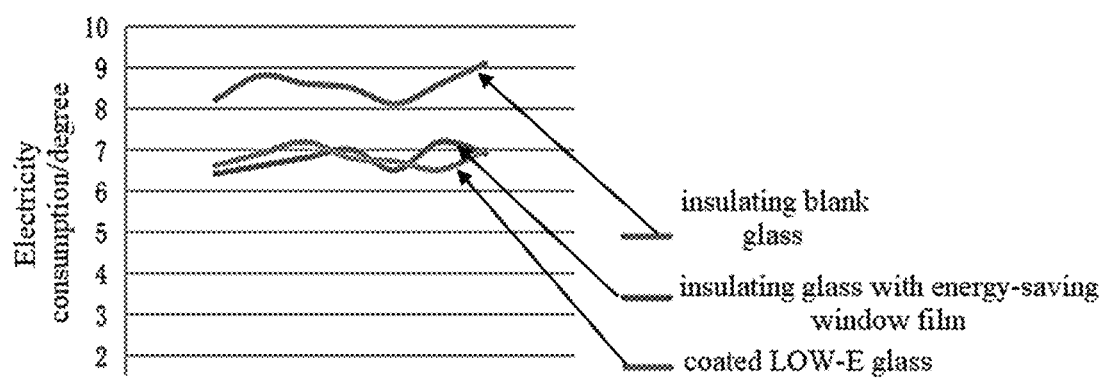
FIG. 2 is a schematic diagram of energy-saving effect comparison tests of the energy-saving window film used for insulating glass in a test example and comparative examples.

Specifically, first of all, the energy-saving and heat preservation effect of the test example is tested. It should be noted that the applicant added an insulating blank glass and a coated LOW-E glass as two comparative examples. Please refer to Table 1 and FIG. 2 for the specific test results. It can be seen from Table 1 and FIG. 2 that the energy-saving window film used for insulating glass provided by the embodiment of the disclosure has the lowest total power consumption and the best energy-saving and heat preservation effect.

TABLE 1

| | | | | |
|---|---|---|---|---|
| energy-saving and heat preservation effect tests | | | | |
| Test days | Maximum outdoor temperature ° C. | Electricity consumption of insulation blank glass/degree | Electricity consumption of insulating glass with energy-saving window film/degree | Electricity consumption of coated LOW-E glass/degree |
| 1 | 35 | 8.2 | 6.4 | 6.6 |
| 2 | 36 | 8.8 | 6.6 | 6.9 |
| 3 | 37 | 8.6 | 6.8 | 7.2 |
| 4 | 36 | 8.5 | 7.0 | 6.8 |
| 5 | 35 | 8.1 | 6.5 | 6.7 |
| 6 | 34 | 8.6 | 7.2 | 6.5 |
| 7 | 35 | 9.1 | 6.9 | 7.0 |
| Total electricity consumption | | 59.9 | 47.4 | 47.7 |
| Energy saving percentage | | | 20.86% | 20.36% |

Further, a residual wind pressure resistance test is performed. It should be noted that this test further adds an insulating glass with built-in sunshade film as a comparative example, and the results are shown in Table 2. It can be seen from the test results that in the three comparative examples, the glass as a whole has fallen off, and only the glass attached to the energy-saving window film used for insulating glass provided by the embodiment of the disclosure has no broken shards of glass, and the glass edge connection structure is also intact.

TABLE 2

| | | |
|---|---|---|
| residual wind pressure resistance test results | | |
| Glass type (10 mm tempered glass) | residual wind pressure resistance test | test results |
| insulating glass with built-in sunshade film | Breaking the glass and performing repeated pressure testing. Pressure fluctuation is in a range of 600 pa to 1000 pa, pressurization 10 times, cycle 5~7 s; pressure fluctuation is in a range of −600 pa~−1000 pa, pressurization 10 times, cycle 5~7 s | The whole glass falls off |
| insulating blank glass | | The whole glass falls off |
| coated LOW-E insulating glass | | The whole glass falls off |
| insulating glass with the energy-saving window film | | The glass diaphragm is intact, no shards of glass fall off, and the glass edge connection structure is intact |

Figure 3:
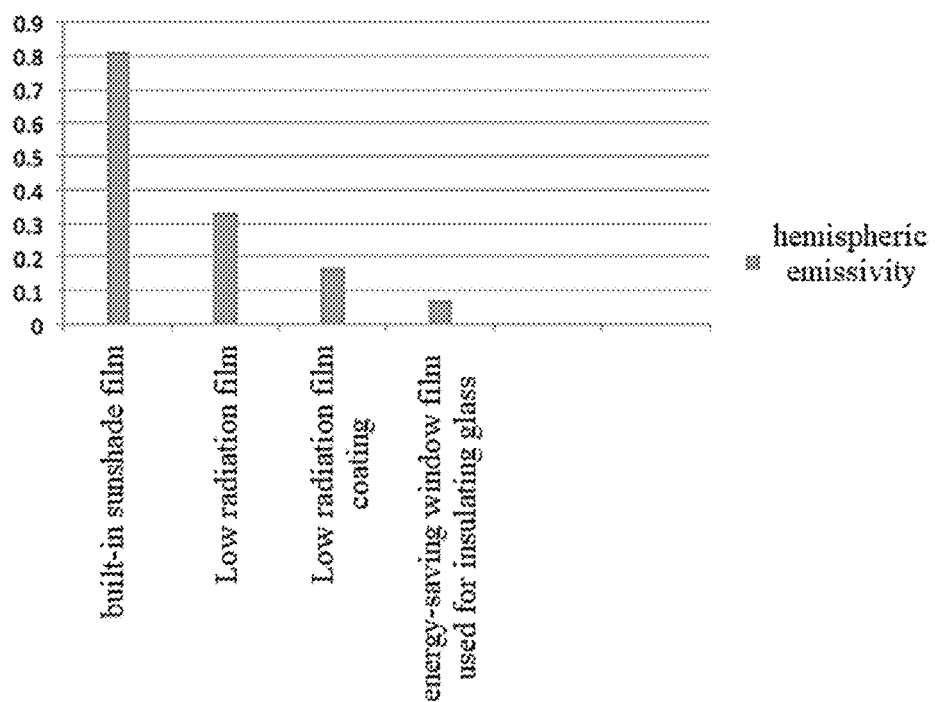
FIG. 3 is a comparison diagram of hemispherical emissivity among the energy-saving window film used for insulating glass in a test examples and comparative examples.

Further, the hemispheric emissivity test is performed, and the test results are shown in Table 3 and FIG. 3. It should be noted that referring to FIG. 3 and Table 3, the insulating glass with the energy-saving window film used for insulating glass has the smallest hemispherical emissivity, which fully proves its best radiation resistance and heat insulation performance.

TABLE 3 hemispheric emissivity

| Glass type | Glass specification | hemispheric emissivity |
|---|---|---|
| insulating glass with built-in sunshade film | 5 + 12 + 5 | 0.812 |
| Low radiation film insulating glass | 5 + 12 + 5 | 0.330 |
| Coated Low-E insulating glass | 5 + 12 + 5 | 0.166 |
| Insulating glass with energy-saving window film used for insulating glass | 5 + 12 + 5 | 0.071 |

Further, the oxidation resistance test is performed, and the test results are shown in Table 4. From the Table 4, it can be seen that the film or the coating in the comparative examples has oxidation and discoloration performance failure, and only the energy-saving window film used for insulating glass provided by the embodiment of the disclosure has no failures such as oxidation, fading and discoloration of the corresponding low-emissivity layer, which fully proves its better oxidation resistance.

TABLE 4

Oxidation resistance

| Glass type | Test conditions | Test results |
|---|---|---|
| Low radiation film | Exposure to 25 ± 5° C., 40%-60% relative humidity, observing whether the film has failures such as oxidation, fading, discoloration, etc., after 168 h. | Oxidation and discoloration of low radiation layer |
| Low-E coating layer | | Oxidation and discoloration of coating |
| Energy-saving window film used for insulating glass | | The low radiation layer has no oxidation, fading, discoloration and other failures |

To sum up, the preparation method of the energy-saving window film used for insulating glass provided by the embodiment of the disclosure can increase the impact strength of the glass and play the role of safety and explosion-proof by using the high-strength base film. Through the magnetron sputtering process, metals, metal oxides, and nitrides (such as $TiO_2$, NiCr, Ag, TiN, $WO_3$, $In_2O_3$, $SnO_2$, etc.) are sputtered on the surface of the high-strength base film in the layer-by-layer manner, which reduces the radiation rate of film layers. The oxidation resistance of the coating is improved by coating the modified polyurethane acrylate protective layer on the surface of the formed low radiation layer. Therefore, the energy-saving window film used for insulating glass proposed in the embodiment of the disclosure has the flexible characteristics that the glass cannot replace, sticking the energy-saving window film on the inner wall of the insulating glass can enhance the impact strength of the glass, effectively reduce the thickness of the glass on two sides, and reduce the weight of the overall structure of the glass; and after the tempered glass is accidentally broken, it can prevent the splashing and falling of shards of the glass from causing personal injury. Moreover, the energy-saving window film provided by the embodiment of the disclosure is a low radiation window film, which further reduces the overall heat transfer performance of the insulating glass. Therefore, the energy-saving window film used for insulating glass and its preparation method provided by the embodiments of the disclosure are applied to the field of glass, and the energy-saving window film as functional film material has important commercial promotion value.

The embodiments described above are part of the embodiments of the disclosure, not all of them. The detailed descriptions of the embodiments of the disclosure are not intended to limit the scope of the disclosure as claimed, but only represent selected embodiments of the disclosure. Based on the embodiments of the disclosure, all other embodiments obtained by those skilled in the art without creative work shall fall within the scope of protection of the disclosure.

What is claimed is:

1. A preparation method of an energy-saving window film used for insulating glass, comprising:
   selecting a base film; wherein the base film comprises two opposite surfaces, which are a first surface and a second surface respectively;
   sputtering materials on the first surface of the base film in a layer-by-layer manner by a magnetron sputtering process to form a radiation layer; wherein the radiation layer comprises: one selected from the group consisting of a structure of $TiO_2/NiCr/Ag/TiO_2/TiO_2/NiCr/Ag/TiO_2$, a structure of $TiN/NiCr/Ag/TiO_2/TiO_2/NiCr/Ag/TiN$, and a structure of $TiN/In_2O_3/Ag/TiO_2/TiO_2/In_2O_3/Ag/TiN$;
   obtaining an installation adhesive liquid and a coating protective liquid after carrying out operations of installation adhesive liquid making and coating protective layer liquid making; and
   coating the coating protective liquid on a surface of the radiation layer to form a coating protective layer; and coating the installation adhesive liquid on the second surface of the base film, drying and then laminating with a protective film.

2. The preparation method of the energy-saving window film used for insulating glass according to claim 1, wherein the base film is one of a polyethylene terephthalate film and a polycarbonate film.

3. The preparation method of the energy-saving window film used for insulating glass according to claim 2, wherein a thickness of each layer of the structure of $TiO_2/NiCr/Ag/TiO_2/TiO_2/NiCr/Ag/TiO_2$ is in a range of 5 nm to 20 nm.

4. The preparation method of the energy-saving window film used for insulating glass according to claim 1, wherein the operation of installation adhesive liquid making comprises: mixing and mechanically stirring 30 to 60 parts of an acrylic resin, 20 to 40 parts of a first solvent, 0.5 to 5 parts of an ultraviolet (UV) absorbent, and 0.5 to 1 parts of a curing agent.

5. The preparation method of the energy-saving window film used for insulating glass according to claim 4, wherein the operation of coating protective layer liquid making comprises: mixing and mechanically stirring 10 to 30 parts of a modified polyurethane acrylate, 5 to 20 parts of other resins, 1 to 10 parts of a photoinitiator, 0.01 to 0.1 parts of a leveling agent and 30 to 50 parts of a second solvent; and wherein components of the other resins comprise pentaerythritol triacrylate (PETA), hexanediol diacrylate (HDDA), trimethylolpropane triacrylate (TMPTA) and acrylic acid.

6. The preparation method of the energy-saving window film used for insulating glass according to claim 5, wherein after coating the coating protective liquid on the surface of the radiation layer, the preparation method further comprises: performing drying and UV curing to form the coating protective layer.

7. The preparation method of the energy-saving window film used for insulating glass according to claim 6, wherein a thickness of the coating protective layer is in a range of 0.5 m to 3 m.

8. The preparation method of the energy-saving window film used for insulating glass according to claim 5, wherein the first solvent comprises one or more selected from the group consisting of toluene, xylene, ethyl acetate, butyl acetate, acetone, butanone and methyl isobutyl ketone; and the second solvent comprises one or more selected from the group consisting of ethanol, toluene, ethyl acetate, butyl acetate, acetone, butanone and methyl isobutyl ketone.

9. An energy-saving window film used for insulating glass, wherein the energy-saving window film used for insulating glass is prepared by the preparation method according to claim 1.

10. A method of application of an energy-saving window film used for insulating glass according to claim 9, comprising: installing the energy-saving window film on at least one surface inside a cavity of the insulating glass.

* * * * *